United States Patent
Ogihara (10) Patent No.: US 9,960,775 B2
(45) Date of Patent: May 1, 2018

(54) PROCESSING APPARATUS AND PROCESSING SYSTEM

(71) Applicant: OLYMPUS CORPORATION, Tokyo (JP)

(72) Inventor: Tomoharu Ogihara, Higashimurayama (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days. days.

(21) Appl. No.: 15/624,931

(22) Filed: Jun. 16, 2017

(65) Prior Publication Data

US 2017/0288684 A1  Oct. 5, 2017

Related U.S. Application Data (63) Continuation of application No. PCT/JP2016/062939, filed on Apr. 25, 2016.

(30) Foreign Application Priority Data

Jun. 30, 2015 (JP) ................. 2015-131912

(51) Int. Cl.
*G06F 7/38* (2006.01)
*H03L 7/095* (2006.01)
(Continued)

(52) U.S. Cl.
CPC ............... *H03L 7/095* (2013.01); *G06F 7/57* (2013.01); *H03K 19/17716* (2013.01)

(58) Field of Classification Search
CPC ...... H03L 7/095; G06F 7/57; H03K 19/17716
(Continued)

(56) References Cited

U.S. PATENT DOCUMENTS

| 4,591,730 A * | 5/1986 | Pennoni | H04B 7/2048 |
| | | | 370/321 |
| 2002/0012300 A1* | 1/2002 | Kim | G11B 7/0045 |
| | | | 369/47.31 |

(Continued)

FOREIGN PATENT DOCUMENTS

| JP | H04-253436 A | 9/1992 |
| JP | H11-308102 A | 11/1999 |

(Continued)

OTHER PUBLICATIONS

International Search Report dated Jul. 19, 2016 issued in PCT/JP2016/062939.

(Continued)

*Primary Examiner* — Tan V. Mai
(74) *Attorney, Agent, or Firm* — Scully, Scott, Murphy & Presser, P.C.

(57) ABSTRACT

A processing apparatus includes an FPGA unit connected to an oscillator configured to output a first clock, wherein the FPGA unit includes: a PLL circuit configured to output a second clock with a frequency of a predetermined ratio with respect to a frequency of the first clock and configured to output a lock signal (detection signal); an input and output monitoring unit configured to detect a ratio between the frequencies of the first clock and the second clock, compare the detected ratio with the predetermined ratio, and output an abnormal signal when the detected ratio does not coincide with the predetermined ratio; and an initialization unit configured to output a reset signal when the input and output monitoring unit outputs the abnormal signal and configured to output the reset signal when the PLL circuit outputs the lock signal.

7 Claims, 7 Drawing Sheets

(51) Int. Cl.
 *H03K 19/177* (2006.01)
 *G06F 7/57* (2006.01)
(58) Field of Classification Search
 USPC .......................................................... 708/490
 See application file for complete search history.

(56) References Cited

U.S. PATENT DOCUMENTS

2009/0284318 A1 11/2009 Machado
2011/0175653 A1 7/2011 Tani et al.

FOREIGN PATENT DOCUMENTS

| JP | 2003-124807 A | 4/2003 |
| JP | 2008-099097 A | 4/2008 |
| JP | 2011-147058 A | 7/2011 |
| JP | 2013-055524 A | 3/2013 |
| JP | 2014-033788 A | 2/2014 |
| WO | WO 2010/033308 A2 | 3/2010 |
| WO | WO 2012/104933 A1 | 8/2012 |

OTHER PUBLICATIONS

Japanese Office Action dated Dec. 13, 2016 issued in JP 2016-553616.

* cited by examiner

| PLL DETECTION SIGNAL | INPUT AND OUTPUT MONITORING UNIT | RESET |
|---|---|---|
| 0 | 0 | 0 |
| 0 | 1 | 0 |
| 1 | 0 | 0 |
| 1 | 1 | 1 |

| FIRST DETECTION SIGNAL | SECOND DETECTION SIGNAL | INPUT AND OUTPUT MONITORING UNIT | RESET |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 1 |

| FF243 | FF242 | XOR OUTPUT |
|---|---|---|
| 0 | 0 | 0 |
| 0 | 1 | 1 |
| 1 | 0 | 1 |
| 1 | 1 | 0 |

FIG. 10

| PLL DETECTION SIGNAL | PHASE DIFFERENCE MONITORING UNIT | RESET |
|---|---|---|
| 0 | 0 | 0 |
| 0 | 1 | 0 |
| 1 | 0 | 0 |
| 1 | 1 | 1 |

PROCESSING APPARATUS AND PROCESSING SYSTEM

CROSS REFERENCE TO RELATED APPLICATION

This application is a continuation application of PCT/JP2016/062939 filed on Apr. 25, 2016 and claims benefit of Japanese Application No. 2015-131912 filed in Japan on Jun. 30, 2015, the entire contents of which are incorporated herein by this reference.

BACKGROUND OF THE INVENTION

1. Field of the Invention

The present invention relates to a processing apparatus and a processing system, and particularly, to a processing apparatus and a processing system including a phase synchronization circuit (PLL circuit).

2. Description of the Related Art

Conventionally, a phase synchronization circuit that is a so-called PLL (phase locked loop) circuit is widely known, the phase synchronization circuit being configured to synchronize phases of a reference input signal input from outside and an output signal by applying feedback control to an oscillator in a loop and causing the oscillator to oscillate such that a phase difference between the reference input signal and an output from the oscillator in the loop becomes constant.

On the other hand, an endoscope including an image pickup device configured to observe a subject is widely used in a medical field and an industrial field. Furthermore, a technique of configuring an endoscope system is known, wherein a signal processing apparatus that is called a video processor detachably connected to an endoscope performs various types of signal processing regarding the endoscope.

Furthermore, the resolution of the image pickup device mounted on the endoscope has further improved in recent years, and higher speed and higher quality are also demanded for driving of the image pickup device. That is, a higher-quality performance is also requested for a clock that drives the image pickup device.

In view of the circumstances, an endoscope has been proposed in recent years, the endoscope including an independent high-quality clock generation unit provided for a clock generation unit in a video processor (Japanese Patent Application Laid-Open Publication No. 2014-033788).

On the other hand, an example has been known in recent years, in which in a connector unit of an endoscope connected to a video processor, various arithmetic circuits configured to perform drive control and the like of an image pickup device arranged on a distal end of the endoscope are configured by a programmable logic device that is a so-called FPGA (field-programmable gate array).

An example is also proposed in which on the FPGA, the clock generation unit on the endoscope side is realized by the PLL as described above, and a clock supplied from the video processor and a clock generated in the endoscope (supplied to the various arithmetic circuits described above) are synchronized based on a clock rate.

As described, the technique of forming a device, such as a PLL circuit, on the FPGA that forms various operation units in the connector unit on the endoscope side is proposed, and the PLL circuit having a function of outputting a lock signal for notifying a locked state at a predetermined frequency is also known.

SUMMARY OF THE INVENTION

An aspect of the present invention provides a processing apparatus including: a programmable logic circuit connected to an oscillator configured to output a first clock, the programmable logic circuit being configured to input the first clock; and a memory storing circuit information of the programmable logic circuit, wherein the programmable logic circuit includes: a phase synchronization circuit configured to generate and output a second clock with a frequency of a predetermined ratio with respect to a frequency of the first clock based on the first clock; a detection unit provided on the phase synchronization circuit and configured to detect an asynchronous state of the first clock and the second clock to output a predetermined detection signal; an arithmetic unit configured to execute a predetermined process based on the second clock; a monitoring unit configured to detect a ratio between the frequencies of the first clock and the second clock, compare the detected ratio with the predetermined ratio, and output a predetermined abnormal signal when the detected ratio does not coincide with the predetermined ratio; and an initialization unit configured to generate a reset signal when the monitoring unit outputs the abnormal signal, also generate the reset signal when the detection unit outputs the detection signal, and output the reset signal to the phase synchronization circuit and the arithmetic unit in either case.

Another aspect of the present invention provides a processing apparatus including: a programmable logic circuit connected to an oscillator configured to output a first clock, the programmable logic circuit being configured to input the first clock; and a memory storing circuit information of the programmable logic circuit, wherein the programmable logic circuit includes: a phase synchronization circuit configured to generate and output a second clock with a frequency of a predetermined ratio with respect to a frequency of the first clock based on the first clock; a detection unit provided on the phase synchronization circuit and configured to detect an asynchronous state of the first clock and the second clock to output a predetermined detection signal; an arithmetic unit configured to execute a predetermined process based on the second clock; a monitoring unit configured to compare two adjacent clock signals in the second clock and output a predetermined abnormal signal when detecting a predetermined phase difference; and an initialization unit configured to generate a reset signal when the monitoring unit outputs the abnormal signal, also generate the reset signal when the detection unit outputs the detection signal, and output the reset signal to the phase synchronization circuit and the arithmetic unit in either case.

Another aspect of the present invention provides a processing apparatus including: a programmable logic circuit connected to an oscillator configured to output a first clock, the programmable logic circuit being configured to input the first clock; and a memory storing circuit information of the programmable logic circuit, wherein the programmable logic circuit includes: a first phase synchronization circuit configured to generate and output a second clock with a frequency of a first predetermined ratio with respect to a frequency of the first clock based on the first clock; a second phase synchronization circuit configured to generate and output a third clock with a frequency of a second predetermined ratio with respect to the frequency of the first clock based on the first clock; a first detection unit provided on the first phase synchronization circuit and configured to detect an asynchronous state of the first clock and the second clock to output a predetermined first detection signal; a second detection unit provided on the second phase synchronization circuit and configured to detect an asynchronous state of the first clock and the third clock to output a predetermined second detection signal; an arithmetic unit including a first arithmetic circuit configured to execute a predetermined process based on the second clock and a second arithmetic circuit configured to execute a predetermined process based on the third clock; a monitoring unit configured to output a predetermined abnormal signal when at least one of the second clock and the third clock is in a predetermined abnormal state; and an initialization unit configured to generate a reset signal when the monitoring unit outputs the abnormal signal, also generate the reset signal when the first detection unit outputs the first detection signal, further generate the reset signal when the second detection unit outputs the second detection signal, and output the reset signal to the phase synchronization circuit and the arithmetic unit in any case.

An aspect of the present invention provides a processing system including: a processing apparatus including: a programmable logic circuit connected to an oscillator configured to output a first clock, the programmable logic circuit being configured to input the first clock; and a memory storing circuit information of the programmable logic circuit, wherein the programmable logic circuit includes: a phase synchronization circuit configured to generate and output a second clock with a frequency of a predetermined ratio with respect to a frequency of the first clock based on the first clock; a detection unit provided on the phase synchronization circuit and configured to detect an asynchronous state of the first clock and the second clock to output a predetermined detection signal; an arithmetic unit configured to execute a predetermined process based on the second clock; a monitoring unit configured to detect a ratio between the frequencies of the first clock and the second clock, compare the detected ratio with the predetermined ratio, and output a predetermined abnormal signal when the detected ratio does not coincide with the predetermined ratio; and an initialization unit configured to generate a reset signal when the monitoring unit outputs the abnormal signal, also generate the reset signal when the detection unit outputs the detection signal, and output the reset signal to the phase synchronization circuit and the arithmetic unit in either case; and the oscillator configured to output the first clock to the programmable logic circuit.

Another aspect of the present invention provides a processing system including: a processing apparatus including: a programmable logic circuit connected to an oscillator configured to output a first clock, the programmable logic circuit being configured to input the first clock; and a memory storing circuit information of the programmable logic circuit, wherein the programmable logic circuit includes: a phase synchronization circuit configured to generate and output a second clock with a frequency of a predetermined ratio with respect to a frequency of the first clock based on the first clock; a detection unit provided on the phase synchronization circuit and configured to detect an asynchronous state of the first clock and the second clock to output a predetermined detection signal; an arithmetic unit configured to execute a predetermined process based on the second clock; a monitoring unit configured to compare two adjacent clock signals in the second clock and output a predetermined abnormal signal when detecting a predetermined phase difference; and an initialization unit configured to generate a reset signal when the monitoring unit outputs the abnormal signal, also generate the reset signal when the detection unit outputs the detection signal, and output the reset signal to the phase synchronization circuit and the arithmetic unit in either case; and the oscillator configured to output the first clock to the programmable logic circuit.

Another aspect of the present invention provides a processing system including: a processing apparatus including: a programmable logic circuit connected to an oscillator configured to output a first clock, the programmable logic circuit being configured to input the first clock; and a memory storing circuit info nation of the programmable logic circuit, wherein the programmable logic circuit includes: a first phase synchronization circuit configured to generate and output a second clock with a frequency of a first predetermined ratio with respect to a frequency of the first clock based on the first clock; a second phase synchronization circuit configured to generate and output a third clock with a frequency of a second predetermined ratio with respect to the frequency of the first clock based on the first clock; a first detection unit provided on the first phase synchronization circuit and configured to detect an asynchronous state of the first clock and the second clock to output a predetermined first detection signal; a second detection unit provided on the second phase synchronization circuit and configured to detect an asynchronous state of the first clock and the third clock to output a predetermined second detection signal; an arithmetic unit including a first arithmetic circuit configured to execute a predetermined process based on the second clock and a second arithmetic circuit configured to execute a predetermined process based on the third clock; a monitoring unit configured to output a predetermined abnormal signal when at least one of the second clock and the third clock is in a predetermined abnormal state; and an initialization unit configured to generate a reset signal when the monitoring unit outputs the abnormal signal, also generate the reset signal when the first detection unit outputs the first detection signal, further generate the reset signal when the second detection unit outputs the second detection signal, and output the reset signal to the phase synchronization circuit and the arithmetic unit in any case; and the oscillator configured to output the first clock to the programmable logic circuit.

DETAILED DESCRIPTION OF THE PREFERRED EMBODIMENTS

Hereinafter, embodiments of the present invention will be described with reference to the drawings.

The invention is not limited by the embodiments. Furthermore, the same reference signs are provided to the same parts in the description of the drawings.

Figure 1:
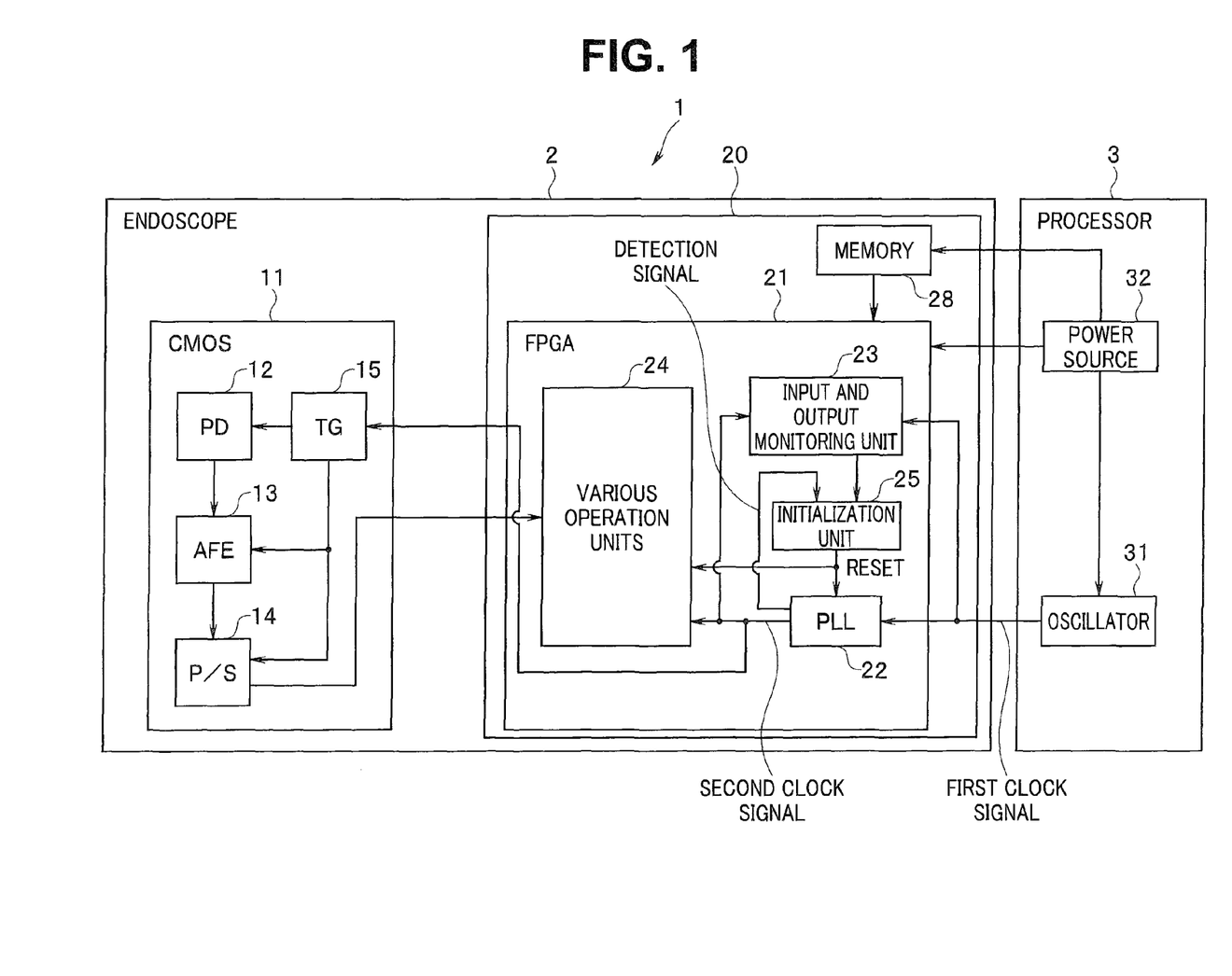
FIG. 1 is a block diagram showing a schematic configuration of an endoscope system including a processing apparatus (endoscope) according to a first embodiment of the present invention.

FIG. 1 is a block diagram showing a schematic configuration of an endoscope system including a processing apparatus according to a first embodiment of the present invention.

Note that in the embodiment illustrated below, an endoscope (particularly, a connector unit provided on an endoscopic side) connected to a video processor will be described as an example of the processing apparatus, and an endoscope system including the endoscope and the video processor will be described as an example of a processing system.

As shown in FIG. 1, an endoscope system 1 mainly includes: an endoscope 2 configured to pick up an in-vivo image of an object by inserting a distal end portion into a body cavity of a subject and configured to output an image signal of the object image; a video processor 3 configured to apply predetermined image processing to the image signal output from the endoscope 2 and comprehensively control operation of the entire endoscope system 1; and a light source apparatus not shown configured to generate illumination light to be emitted from a distal end of the endoscope 2.

First, the video processor 3 includes a control unit and an image processing unit not shown and further includes: an oscillator 31 configured to generate and output a predetermined driving clock (first clock signal); and a power source 32 configured to supply a predetermined drive power source to the endoscope 2.

The endoscope 2 includes: an image pickup device (CMOS sensor) 11 configured to receive an object image to photoelectrically convert the object image to an electrical signal and configured to execute predetermined signal processing; and a connector unit 20 that is a connector substrate connected to the video processor 3, the connector unit 20 including various arithmetic circuits and the like configured to perform drive control and the like of the CMOS sensor 11.

The CMOS sensor 11 includes: a timing generator (TG) 15 configured to generate a clock signal, a horizontal synchronization signal HD, a vertical synchronization signal VD, and pulses for various types of signal processing according to operation specifications of the CMOS sensor 11 based on a clock signal (described in detail later) generated by the connector unit 20 and predetermined synchronization signals HD and VD (not shown) transmitted from the video processor 3; an image pickup unit 12 (PD 12) configured to pick up an optical image of the subject based on the clock signal, the horizontal synchronization signal HD, and the vertical synchronization signal VD generated by the timing generator 15 to generate a predetermined analog image pickup signal; an AFE circuit 13 including an A/D conversion unit configured to apply predetermined signal processing to the image pickup unit 12 and convert the image to output a digital image pickup signal; and a P/S circuit 14 configured to perform parallel/serial conversion of the digital image pickup signal from the AFE circuit 13 and output the signal to a later stage.

The connector unit 20 is a connector unit arranged on a back end portion of the endoscope and connected to the video processor 3, the connector unit 20 including: an FPGA unit 21 in which the various arithmetic circuits and the like configured to perform the drive control and the like of the CMOS sensor 11 are formed by a digital programmable logic circuit that is a so-called FPGA (field-programmable gate array); and a memory 28 storing circuit information of the FPGA.

In the present embodiment, each circuit formed in the FPGA unit 21 is as follows.

That is, the FPGA unit 21 mainly forms: a PLL circuit 22 configured to input the first clock signal generated by the oscillator 31 in the video processor 3 as a reference clock signal and configured to output a second clock signal synchronized with the first clock signal; an input and output monitoring unit 23 configured to input the first clock signal from the oscillator 31 and the second clock signal output from the PLL circuit 22 and configured to monitor a clock frequency ratio between the first clock signal and the second clock signal; an initialization unit 25 capable of outputting a predetermined initialization signal (reset signal) based on a detection signal output from the PLL circuit 22 and a monitoring output signal from the input and output monitoring unit 23; and various operation units 24 configured to input the second clock signal to perform various types of predetermined arithmetic processing.

The PLL circuit 22 configures a well-known phase synchronization circuit that is a so-called PLL (phase locked loop) circuit configured to input a phase difference between an input signal (the first clock signal in the present embodiment) that is a reference frequency and a feedback signal output from a voltage-controlled oscillator (for example, VCXO (voltage-controlled crystal oscillator)) in a loop to the oscillator to synchronize phases of the input signal and an output signal (the second clock signal in the present embodiment).

The second clock signal output from the PLL circuit 22 and synchronized with the first clock signal is output to the various operation units 24, the timing generator 15 in the CMOS sensor 11, and the like.

The PLL circuit 22 is configured to output a lock signal of an "H" state as a detection signal when the state is a locked state at a predetermined frequency, that is, when the input signal as a reference and the output signal are normally in the synchronous state.

On the other hand, the PLL circuit 22 is configured to output a lock signal of an "L" state as a detection signal when the locked state at the predetermined frequency is lost, that is, when the input signal as a reference and the output signal are in an asynchronous state.

Next, the input and output monitoring unit 23 and the initialization unit 25 will be described.

Figure 2:
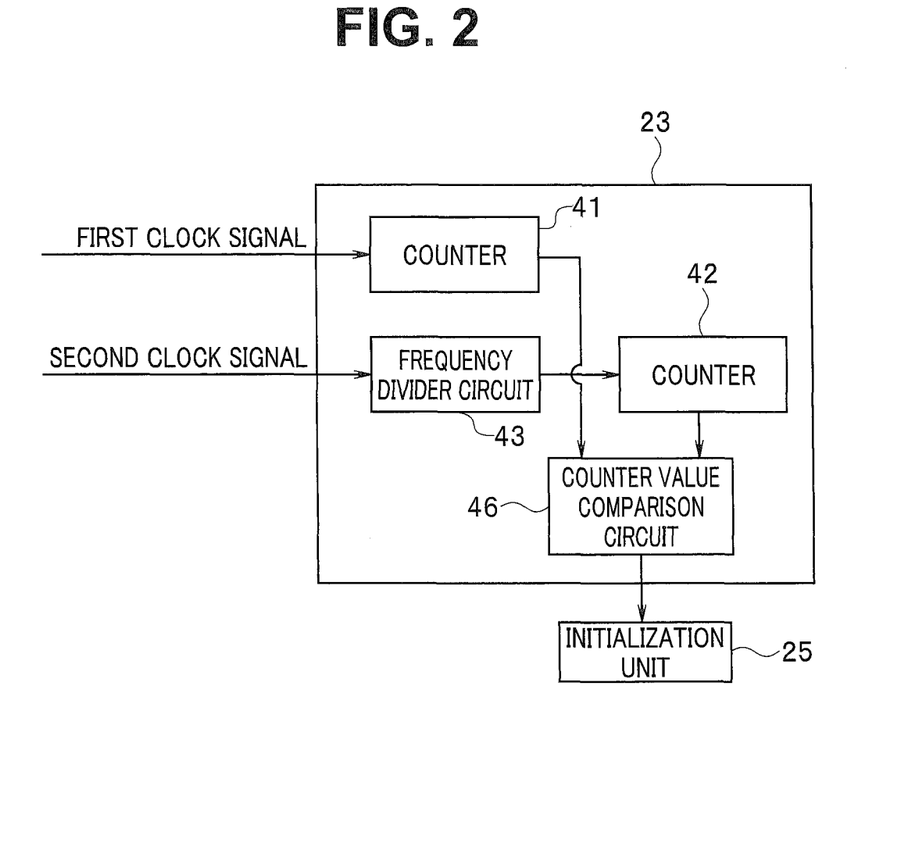
FIG. 2 is a block diagram showing a configuration of an input and output monitoring unit and an initialization unit in the processing apparatus according to the first embodiment.

FIG. 2 is a block diagram showing a configuration of the input and output monitoring unit and the initialization unit in the processing apparatus (endoscope) according to the first embodiment.

As shown in FIG. 2, the input and output monitoring unit 23 includes terminals configured to input the first clock signal output from the oscillator 31 of the video processor 3 and the second clock signal output from the PLL circuit 22 and includes: a counter 41 configured to input and count the first clock signal; a frequency divider circuit 43 configured to input the second clock signal and divide the second clock signal into a predetermined frequency; and a counter 42 configured to input and count the signal divided by the frequency divider circuit 43.

The input and output monitoring unit 23 further includes a counter value comparison circuit 46 configured to input output signals of the counter 41 and the counter 42 to compare counter value information of the output signals and configured to output a comparison result to the initialization unit 25.

The counter 41 and the counter 42 are configured to count up clocks of the respectively input first clock signal and second clock signal and output counter values.

By the way, the clock frequency of the reference input signal (first clock signal) input to the PLL circuit 22 and the clock frequency of the output signal (second clock signal) synchronized with the first clock signal and output by the PLL circuit 22 are already-known values in designing the PLL circuit 22 in the present embodiment.

Therefore, when, for example, the clock frequency of the input signal (first clock signal) as a reference is 40 MHz, and the clock frequency of the output signal (second clock signal) is 80 MHz, that is, when the clock frequencies are in a relationship of an already-known "predetermined ratio", a relationship between the counter values of the counter 41 and the counter 42 is as follows according to the predetermined ratio between the clock frequencies at a normal time in which the second clock signal is accurately synchronized with the first clock signal.

$$2\times\text{the number of clocks of first clock signal}=\text{the number of clocks of second clock signal} \quad (1)$$

On the other hand, the relationship between the counter values of the counter 41 and the counter 42 is as follows at an abnormal time in which the ratio between the clock frequency of the second clock signal and the clock frequency of the first clock signal does not coincide with the "predetermined ratio", such as when the second clock signal and the first clock signal are not accurately synchronized for some factors.

$$2\times\text{the number of clocks of first clock signal}=\text{the number of clocks of second clock signal} \quad (2)$$

The counter value comparison circuit 46 inputs the output signals (counter value information) of the counter 41 and the counter 42 and compares the counter values of the output signals.

In the present embodiment, the counter value comparison circuit 46 is configured to output a signal of the "H" state indicating that there is no abnormality when the counter values of the counter 41 and the counter 42 are in the relationship of equation (1), that is, when the second clock signal is accurately synchronized with the first clock signal, and the ratio between the clock frequency of the second clock signal and the clock frequency of the first clock signal coincides with the "predetermined ratio" described above.

On the other hand, the counter value comparison circuit 46 is configured to output a signal of the "L" state indicating that there is an abnormality when the counter values of the counter 41 and the counter 42 are in the relationship of expression (2), that is, when the ratio between the clock frequency of the second clock signal and the clock frequency of the first clock signal does not coincide with the "predetermined ratio" described above.

The frequency divider circuit 43 is a circuit configured to input the second clock signal and divide the second clock signal into a predetermined frequency, and in the present embodiment, the frequency divider circuit 43 is configured to divide the second clock signal by, for example, 2 when the clock frequency of the reference input signal (first clock signal) is 40 MHz, and the clock frequency of the output signal (second clock signal) is 80 MHz as described above.

In this way, the input and output monitoring unit 23 plays a role as a monitoring unit configured to input the first clock signal from the oscillator 31 and the second clock signal output from the PLL circuit 22, monitor (detect) the clock frequency ratio between the first clock signal and the second clock signal, and output a predetermined monitoring output signal according to whether the detected clock frequency ratio coincides or does not coincide with the "predetermined ratio", and particularly, configured to output an abnormal signal when the detected clock frequency ratio does not coincide with the "predetermined ratio".

Figure 3:
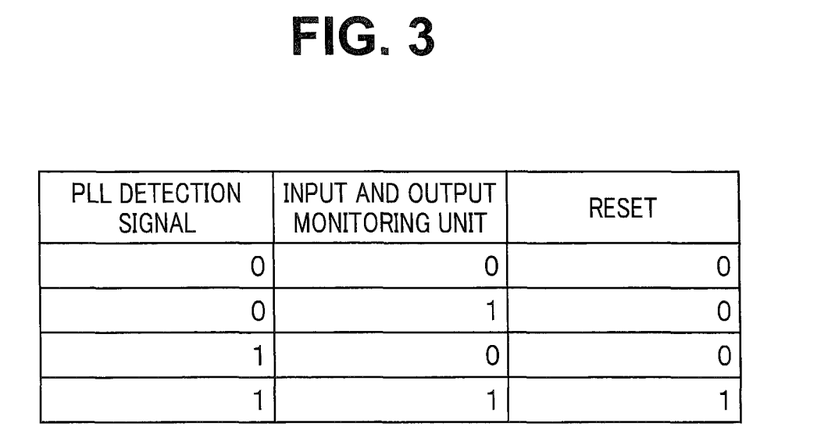
FIG. 3 is a chart showing a truth table of the initialization unit in the processing apparatus according to the first embodiment.

FIG. 3 is a chart showing a truth table of the initialization unit in the processing apparatus (endoscope) according to the first embodiment.

The initialization unit 25 is configured by an AND circuit configured to generate a logical product of the detection signal output from the PLL circuit 22 and the signal output from the input and output monitoring unit 23.

That is, the initialization unit 25 is configured to input the "detection signal" from the PLL circuit 22 and the "monitoring output signal" from the input and output monitoring unit 23 and configured to output an active "L" reset signal according to the logical product of the signals.

More specifically, as shown in the truth table of FIG. 3, the active "L" reset signal is output when the locked state at the predetermined frequency is lost in the PLL circuit 22 for some factors (in this case, "detection signal" is "L" signal) or when the clock frequency ratio between the second clock signal and the first clock signal does not coincide with the "predetermined ratio" in the input and output monitoring unit 23 for some factors (in this case, "monitoring output signal" is "L" signal).

In the present embodiment, the reset signal output from the initialization unit 25 is input to the PLL circuit 22, and the PLL circuit 22 that has received the reset signal starts a new PLL process.

The reset signal output from the initialization unit 25 is also input to predetermined circuits of the various operation units 24 that are circuits formed inside of the FPGA, and each of the corresponding circuits is surely reset.

By the way, although the abnormal state can be recognized by the lock signal (detection signal) when the locked state regarding the second clock signal is lost in the PLL circuit 22 as described above, the PLL circuit may be actually in an unlocked state even when the PLL circuit recognizes that the state is the locked state and outputs the lock signal of the normal state as described above.

In this case, the phase and the frequency of the second clock signal that is an output clock signal of the PLL circuit 22 are in an abnormal state, and normal operation of each process may be interfered in the arithmetic circuits of the various operation units 24 and the like in the FPGA 21 that use the output clock signal.

The present invention has been made in view of the circumstances, and according to the first embodiment, an abnormality in the output clock signal of the PLL circuit 22 is determined not only when the detection signal indicating the abnormal state (lock signal indicating the unlocked state) is output because the locked state at the predetermined frequency is lost in the PLL circuit 22 for some factors, but also when the input and output monitoring unit 23 detects that the clock frequency ratio between the second clock signal and the first clock signal does not coincide with the "predetermined ratio" obtained in advance even when the detection signal (lock signal indicating the unlocked state) is not output in the abnormal state. The initialization unit 25 outputs the reset signal, and the PLL circuit 22 and the corresponding circuits of the various operation units 24 in the FPGA unit 21 can be surely reset.

Second Embodiment

Next, a second embodiment of the present invention will be described.

Figure 4:
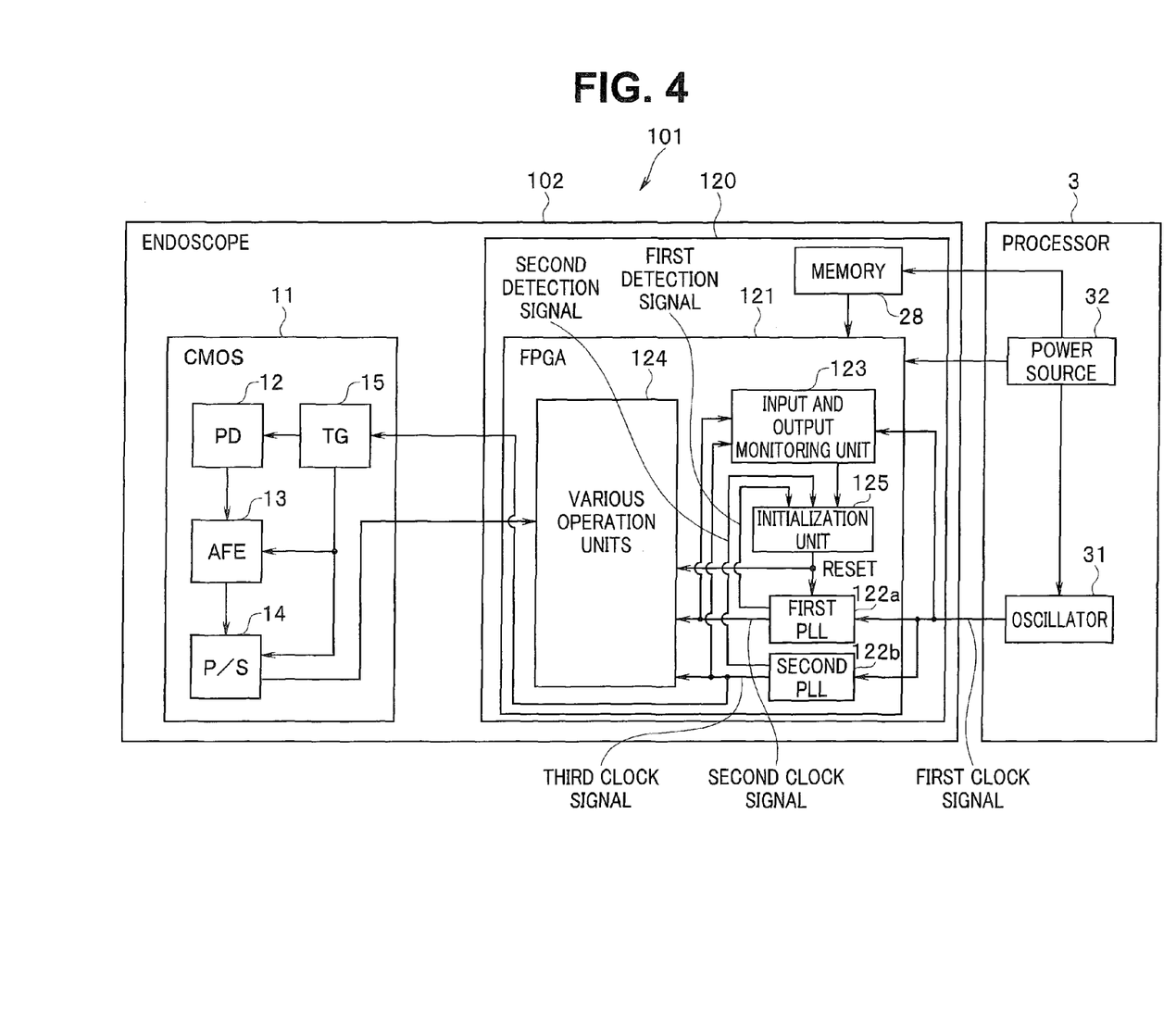
FIG. 4 is a block diagram showing a schematic configuration of an endoscope system including a processing apparatus (endoscope) according to a second embodiment of the present invention.

FIG. 4 is a block diagram showing a configuration of an endoscope system including a processing apparatus (endoscope) according to the second embodiment of the present invention.

The configuration of the endoscope system including the processing apparatus of the second embodiment is basically the same as in the first embodiment. Therefore, only differences from the first embodiment will be described here, and other detailed description will not be repeated.

As described, the processing apparatus of the first embodiment includes one PLL circuit 22 as a PLL circuit in the FPGA unit 21, and the input and output monitoring unit 23 monitors the clock frequency ratio between the first clock signal input to the one PLL circuit 22 (first clock signal from the oscillator 31 of the video processor 3) and the second clock signal that is an output signal of the PLL circuit 22.

On the other hand, the processing apparatus of the second embodiment includes a plurality of PLL circuits in the FPGA unit and also includes an input and output monitoring unit configured to monitor clock frequency ratios between the first clock signal input to each of the plurality of PLL circuits (first clock signal from the oscillator 31 of the video processor 3) and clock signals that are output signals of the respective PLL circuits.

As shown in FIG. 4, an endoscope system 101 of the second embodiment mainly includes, as in the first embodiment: an endoscope 102 configured to pick up an in-vivo image of an object by inserting a distal end portion into a body cavity of a subject and configured to output an image signal of the object image; the video processor 3 as in the first embodiment configured to apply predetermined image processing to the image signal output from the endoscope 102 and configured to comprehensively control operation of the entire endoscope system 101; and the light source apparatus not shown configured to generate illumination light to be emitted from a distal end of the endoscope 102.

As in the first embodiment, the video processor 3 in the second embodiment also includes the control unit and the image processing unit not shown and includes: the oscillator 31 configured to generate and output a predetermined driving clock (first clock signal); and the power source 32 configured to supply a predetermined drive power source to the endoscope 102.

The endoscope 102 further includes: the image pickup device (CMOS sensor) 11 as in the first embodiment; and a connector unit 120 that is a connector substrate connected to the video processor 3, the connector unit 120 including various arithmetic circuits and the like configured to perform drive control and the like of the CMOS sensor 11.

As in the first embodiment, the connector unit 120 includes: an FPGA unit 121 in which the various arithmetic circuits and the like configured to perform the drive control and the like of the CMOS sensor 11 are formed by an FPGA; and the memory 28 storing circuit information of the FPGA.

In the second embodiment, the FPGA unit 121 mainly forms: a first PLL circuit 122a configured to input the first clock signal generated by the oscillator 31 in the video processor 3 as a reference clock signal and configured to output a second clock signal synchronized with the first clock signal; a second PLL circuit 122b similarly configured to input the first clock signal as a reference clock signal and configured to output a third clock signal synchronized with the first clock signal; an input and output monitoring unit 123 configured to input the first clock signal from the oscillator 31, the second clock signal output from the first PLL circuit 122a, and the third clock signal output from the second PLL circuit 122b and configured to monitor a clock frequency ratio between the first clock signal and the second clock signal and a clock frequency ratio between the first clock signal and the third clock signal; an initialization unit 125 capable of outputting a predetermined initialization signal (reset signal) based on a first detection signal output from the first PLL circuit 122a, a second detection signal output from the second PLL circuit 122b, and a monitoring output signal from the input and output monitoring unit 123; and various operation units 124 configured to input the second clock signal or the third clock signal to perform various types of predetermined arithmetic processing.

Each of the first PLL circuit 122a and the second PLL circuit 122b configures a well-known phase synchronization circuit that is a so-called PLL (phase locked loop) circuit configured to input a phase difference between an input signal (the first clock signal in the present embodiment) that is a reference frequency and a feedback signal output from a voltage-controlled oscillator (for example, VCXO (voltage-controlled crystal oscillator)) in a loop to the oscillator to synchronize phases of the input signal and an output signal (one of the second clock signal and the third clock signal in the present embodiment).

Then, the second clock signal output from the first PLL circuit 122a and the third clock signal output from the second PLL circuit 122b are output to the various operation units 124, and the third clock signal is output to the timing generator 15 and the like in the CMOS sensor 11.

Furthermore, the first PLL circuit 122a and the second PLL circuit 122b are configured to output lock signals of the "H" state as a first detection signal or a second detection signal, respectively, when the state is a locked state at a predetermined frequency, that is, when the input signal as a reference and the output signal are normally in the synchronous state.

On the other hand, the first PLL circuit 122a and the second PLL circuit 122b are configured to output lock signals of the "L" state as a first detection signal or a second detection signal, respectively, when the locked state at the predetermined frequency is lost, that is, when the input signal as a reference and the output signal are in an asynchronous state.

Next, the input and output monitoring unit 123 and the initialization unit 125 will be described.

Figure 5:
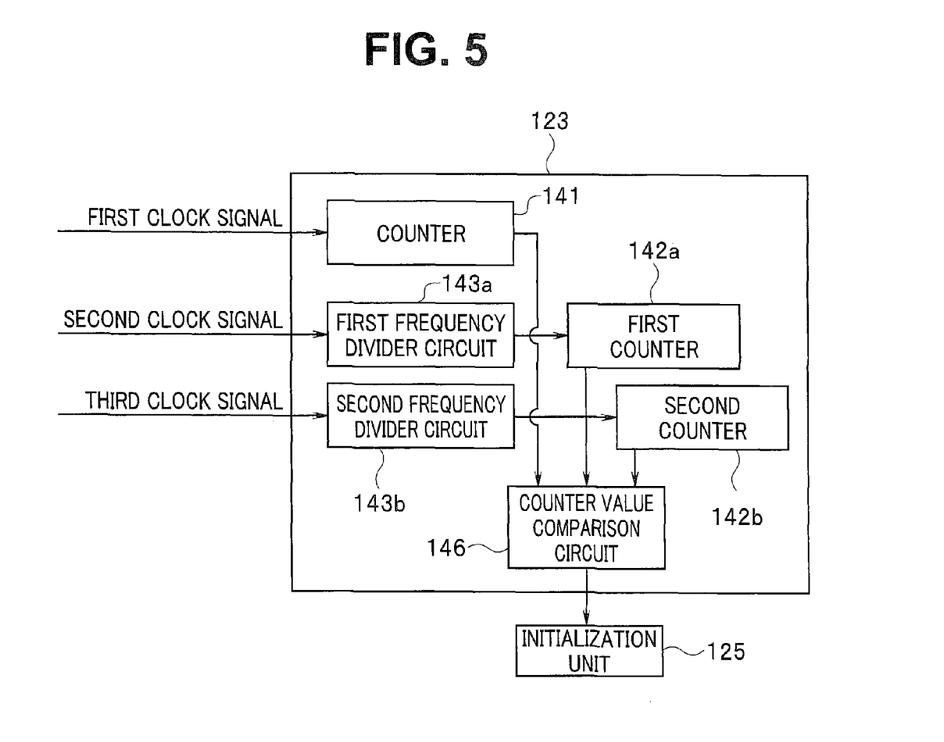
FIG. 5 is a block diagram showing a configuration of an input and output monitoring unit and an initialization unit in the processing apparatus according to the second embodiment.

FIG. 5 is a block diagram showing a configuration of the input and output monitoring unit and the initialization unit in the processing apparatus (endoscope) according to the second embodiment.

As shown in FIG. 5, the input and output monitoring unit 123 includes terminals configured to input the first clock signal output from the oscillator 31 of the video processor 3, the second clock signal output from the first PLL circuit 122a, and the third clock signal output from the second PLL circuit 122b and includes: a counter 141 configured to input and count the first clock signal; a first frequency divider circuit 143a configured to input the second clock signal and divide the second clock signal into a predetermined frequency; a second frequency divider circuit 143b configured to input the third clock signal and divide the third clock signal into a predetermined frequency; a counter 142a configured to input and count the signal divided by the first frequency divider circuit 143a; and a counter 142b configured to input and count the signal divided by the second frequency divider circuit 143b.

The input and output monitoring unit 123 further includes a counter value comparison circuit 146 configured to input output signals of the counter 141, the counter 142a, and the counter 142b to compare counter value information of the counter 141 and the counter 142a and counter value information of the counter 141 and the counter 142b and configured to output comparison results to the initialization unit 125.

The counter 141, the counter 142a, and the counter 142b are configured to count up clocks of the respectively input first clock signal, second clock signal, and third clock signal and output counter values.

By the way, the clock frequency of the reference input signal (first clock signal) input to the first PLL circuit 122a and the second PLL circuit 122b, the clock frequency of the output signal (second clock signal) synchronized with the first clock signal and output by the first PLL circuit 122a, and the clock frequency of the output signal (third clock signal) synchronized with the first clock signal and output by the second PLL circuit 122b are already-known values in designing the first PLL circuit 122a and the second PLL circuit 122b in the second embodiment, and this is the same as in the first embodiment.

Therefore, when, for example, the clock frequency of the input signal (first clock signal) as a reference is 40 MHz, and the clock frequencies of the output signals (second clock signal and third clock signal) are 80 MHz and 120 MHz, respectively, that is, when the clock frequencies of the first clock signal and the second clock signal and the clock frequencies of the first clock signal and the third clock signal are in relationships of already-known "predetermined ratios", a relationship between the counter values of the counter 141 and the counter 142a is as follows according to the predetermined ratio between the clock frequencies at the normal time in which the second clock signal and the third clock signal are accurately synchronized with the first clock signal.

$$2 \times \text{the number of clocks of first clock signal} = \text{the number of clocks of second clock signal} \quad (3)$$

Similarly, a relationship between the counter values of the counter 141 and the counter 142b is as follows according to the predetermined ratio between the clock frequencies.

$$3 \times \text{the number of clocks of first clock signal} = \text{the number of clocks of third clock signal} \quad (4)$$

On the other hand, the relationship between the counter values of the counter 141 and the counter 142a is as follows at the abnormal time in which one or both of the ratio between the clock frequency of the second clock signal and the clock frequency of the first clock signal and the ratio between the clock frequency of the third clock signal and the clock frequency of the first clock signal do not coincide with the "predetermined ratios", such as when the second clock signal and the first clock signal or the third clock signal and the first clock signal are not accurately synchronized for some factors.

$$2 \times \text{the number of clocks of first clock signal} \neq \text{the number of clocks of second clock signal} \quad (5)$$

Similarly, the relationship between the counter values of the counter 141 and the counter 142b is as follows.

$$3 \times \text{the number of clocks of first clock signal} \neq \text{the number of clocks of third clock signal} \quad (6)$$

The counter value comparison circuit 146 inputs counter value information of the counter 141, the counter 142a, and the counter 142b and compares the counter values of the counter 141 and the counter 142a and the counter values of the counter 141 and the counter 142b.

In the second embodiment, the counter value comparison circuit 146 is configured to output a signal of the "H" state indicating that there is no abnormality when the counter values of the counter 141 and the counter 142a are in the relationship of equation (3), that is, when the second clock signal is accurately synchronized with the first clock signal, and the ratio between the clock frequency of the second clock signal and the clock frequency of the first clock signal coincides with the "predetermined ratio", and when the counter values of the counter 141 and the counter 142b are in the relationship of equation (4), that is, when the third clock signal is accurately synchronized with the first clock signal, and the ratio between the clock frequency of the third clock signal and the clock frequency of the first clock signal coincides with the "predetermined ratio".

On the other hand, the counter value comparison circuit 146 is configured to output a signal of the "L" state indicating that there is an abnormality when the counter values of the counter 141 and the counter 142a are in the relationship of expression (5), that is, when the ratio between the clock frequency of the second clock signal and the clock frequency of the first clock signal does not coincide with the "predetermined ratio", or when the counter values of the counter 141 and the counter 142b are in the relationship of expression (6), that is, when the ratio between the clock frequency of the third clock signal and the clock frequency of the first clock signal does not coincide with the "predetermined ratio".

The first frequency divider circuit 143a and the second frequency divider circuit 143b in the second embodiment are configured to divide the second clock signal by 2 and divide the third clock signal by 3, respectively, when, for example, the clock frequency of the reference input signal (first clock signal) is 40 MHz and the clock frequencies of the output signals (second clock signal and third clock signal) are 80 MHz and 120 MHz, respectively, as described above.

In this way, the input and output monitoring unit 123 plays a role as a monitoring unit configured to input the first clock signal from the oscillator 31 and the second clock signal and the third clock signal output from the first PLL circuit 122a and the second PLL circuit 122b, monitor (detect) the clock frequency ratio between the first clock signal and the second clock signal and the clock frequency ratio between the first clock signal and the third clock signal, and output a predetermined monitoring output signal according to whether the detected clock frequency ratios coincide or do not coincide with the "predetermined ratios", and particularly, configured to output an abnormal signal when the detected clock frequency ratios do not coincide with the "predetermined ratios".

Figure 6:
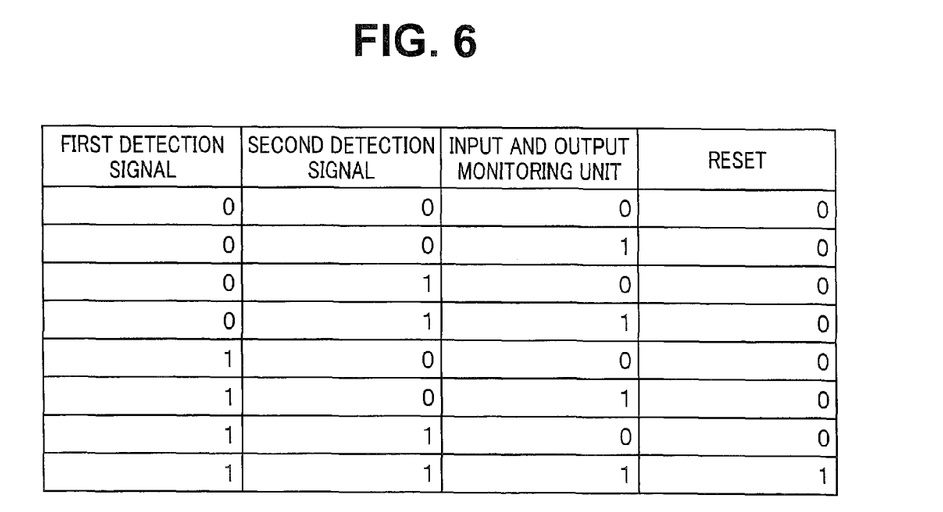
FIG. 6 is a chart showing a truth table of the initialization unit in the processing apparatus according to the second embodiment.

FIG. 6 is a chart showing a truth table of the initialization unit in the processing apparatus (endoscope) according to the second embodiment.

The initialization unit 125 is configured by an AND circuit configured to generate a logical product of the first detection signal output from the first PLL circuit 122a, the second detection signal output from the second PLL circuit 122b, and the monitoring output signal output from the input and output monitoring unit 123.

That is, the initialization unit 125 is configured to input the "detection signal (first detection signal)" from the first PLL circuit 122a, the "detection signal (second detection signal)" from the second PLL circuit 122b, and the "monitoring output signal" from the input and output monitoring unit 123 and configured to output an active "L" reset signal according to the logical product of the signals.

More specifically, as shown in the truth table of FIG. 6, the active "L" reset signal is output when the locked state at the predetermined frequency is lost in one of the first PLL circuit 122a and the second PLL circuit 122b for some factors (in this case, "one of the first detection signal and the second detection signal" is "L" signal), or when the clock frequency ratio between the second clock signal and the first clock signal does not coincide with the "predetermined ratio" or the clock frequency ratio between the third clock signal and the first clock signal does not coincide with the "predetermined ratio" in the input and output monitoring unit 123 for some factors (in this case, "monitoring output signal" is "L" signal).

In the second embodiment, the reset signal output from the initialization unit 125 is input to the first PLL circuit 122a and the second PLL circuit 122b, and the first PLL circuit 122a and the second PLL circuit 122b that have received the reset signal start a new PLL process.

The reset signal output from the initialization unit 125 is also input to predetermined circuits of the various operation units 124 that are circuits formed inside of the FPGA, and each of the corresponding circuits is surely reset.

As described, according to the second embodiment, the initialization unit 125 outputs the reset signal not only when the detection signal indicating the abnormal state (lock signal indicating the unlocked state) is output because the locked state at the predetermined frequency is lost in one of the first PLL circuit 122a and the second PLL circuit 122b for some factors, but also when the input and output monitoring unit 123 detects that the clock frequency ratio between the second clock signal and the first clock signal does not coincide with the "predetermined ratio" obtained in advance or the clock frequency ratio between the third clock signal and the first clock signal does not coincide with the "predetermined ratio" obtained in advance even when the detection signal (lock signal indicating the unlocked state) is not output in the abnormal state. The first PLL circuit 122a, the second PLL circuit 122b, and the corresponding circuits of the various operation units 124 in the FPGA unit 121 can be surely reset.

Third Embodiment

Next, a third embodiment of the present invention will be described.

Figure 7:
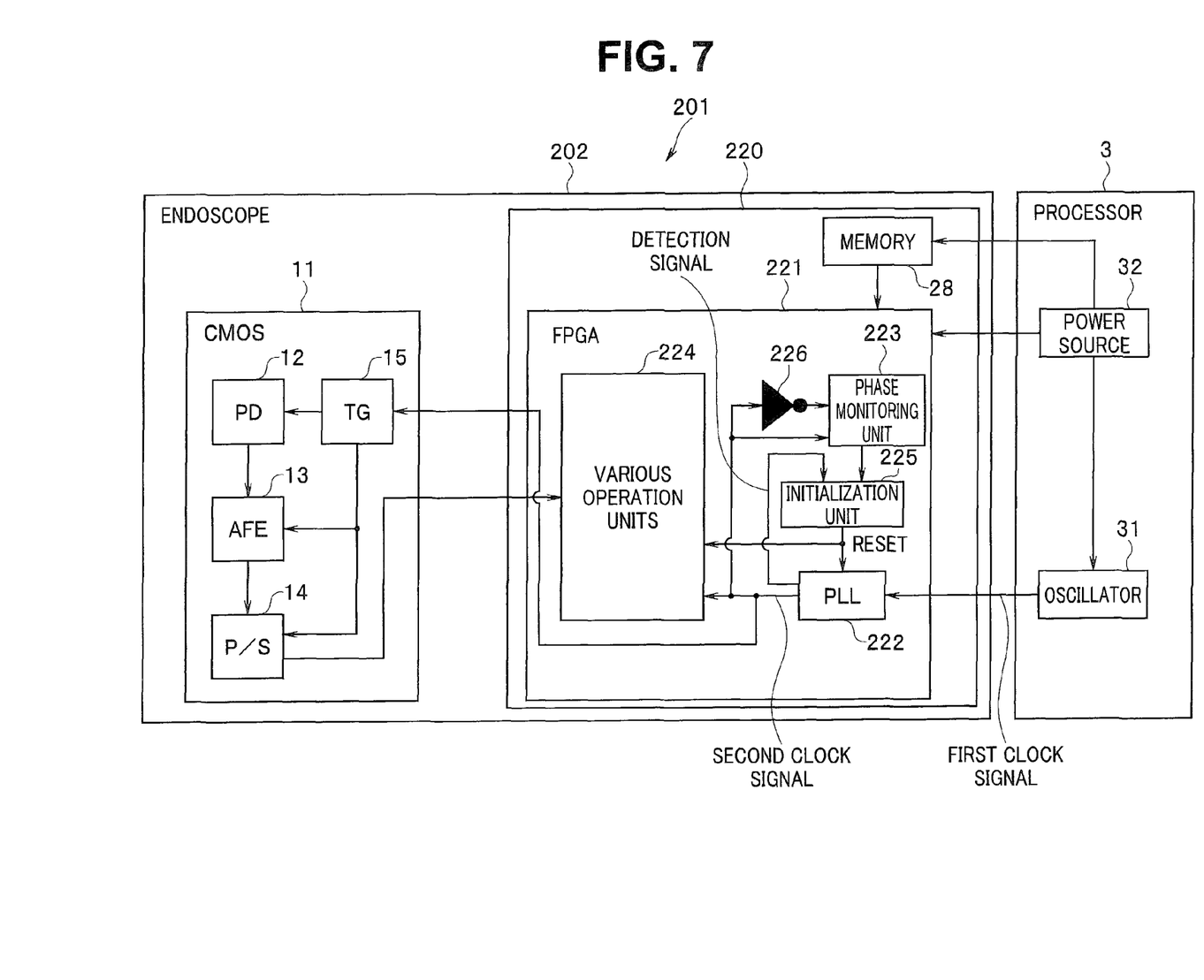
FIG. 7 is a block diagram showing a schematic configuration of an endoscope system including a processing apparatus (endoscope) according to a third embodiment of the present invention.

FIG. 7 is a block diagram showing a configuration of an endoscope system including a processing apparatus (endoscope) according to the third embodiment of the present invention.

The configuration of the endoscope system including the processing apparatus of the third embodiment is basically the same as in the first embodiment. Therefore, only differences from the first embodiment will be described here, and other detailed description will not be repeated.

As described, in the processing apparatus of the first embodiment, the input and output monitoring unit 23 compares the clock frequency ratio between the second clock signal and the first clock signal with the "predetermined ratio" obtained in advance and determines that there is an abnormality in the output clock signal of the PLL circuit 22 when the input and output monitoring unit 23 detects that the ratios do not coincide. The initialization unit 25 outputs the reset signal, and the PLL circuit 22 and the corresponding circuits in the various operation units 24 in the FPGA unit 21 are surely reset.

On the other hand, the processing apparatus of the third embodiment monitors the phase difference between adjacent clocks in the output signal of the PLL circuit formed in the FPGA to detect an abnormality of the output clock signal of the PLL circuit, and the initialization unit outputs the reset signal.

As shown in FIG. 7, an endoscope system 201 of the third embodiment mainly includes, as in the first embodiment: an endoscope 202 configured to pick up an in-vivo image of an object by inserting a distal end portion into a body cavity of a subject and configured to output an image signal of the object image; the video processor 3 as in the first embodiment configured to apply predetermined image processing to the image signal output from the endoscope 202 and configured to comprehensively control operation of the entire endoscope system 201; and the light source apparatus not shown configured to generate illumination light to be emitted from a distal end of the endoscope 202.

As in the first embodiment, the video processor 3 of the third embodiment also includes the control unit and the image processing unit not shown and includes: the oscillator 31 configured to generate and output a predetermined driving clock (first clock signal); and the power source 32 configured to supply a predetermined drive power source to the endoscope 202.

The endoscope 202 further includes: the image pickup device (CMOS sensor) 11 as in the first embodiment; and a connector unit 220 that is a connector substrate connected to the video processor 3, the connector unit 220 including various arithmetic circuits and the like configured to perform drive control and the like of the CMOS sensor 11.

As in the first embodiment, the connector unit 220 includes: an FPGA unit 221 in which the various arithmetic circuits and the like configured to perform the drive control and the like of the CMOS sensor 11 are formed by an FPGA; and the memory 28 storing circuit information of the FPGA.

In the third embodiment, the FPGA unit 221 mainly forms: a PLL circuit 222 configured to input the first clock signal generated by the oscillator 31 in the video processor 3 as a reference clock signal and configured to output a second clock signal synchronized with the first clock signal; a phase difference monitoring unit 223 configured to input the second clock signal output from the PLL circuit 222 to monitor displacement of phase difference in the second clock signal; an initialization unit 225 capable of outputting a predetermined initialization signal (reset signal) based on a detection signal output from the PLL circuit 222 and a monitoring output signal from the phase difference monitoring unit 223; and various operation units 224 configured to input the second clock signal to perform various types of predetermined arithmetic processing.

The PLL circuit 222 configures a well-known phase synchronization circuit that is a so-called PLL (phase locked loop) circuit configured to input a phase difference between an input signal (the first clock signal in the present embodiment) that is a reference frequency and a feedback signal output from a voltage-controlled oscillator (for example, VCXO (voltage-controlled crystal oscillator)) in a loop to the oscillator to synchronize phases of the input signal and an output signal (the second clock signal in the present embodiment) as in the first embodiment.

Then, the second clock signal output from the PLL circuit 222 is output to the various operation units 224, the timing generator 15 in the CMOS sensor 11, and the like.

Furthermore, the PLL circuit 222 is configured to output a lock signal of the "H" state as a detection signal when the state is a locked state at a predetermined frequency, that is, when the input signal as a reference and the output signal are normally in the synchronous state.

On the other hand, the PLL circuit 222 is configured to output a lock signal of the "L" state as a detection signal when the locked state at the predetermined frequency is lost, that is, when the input signal as a reference and the output signal are in an asynchronous state.

Next, the phase difference monitoring unit 223 and the initialization unit 225 will be described.

Figure 8:
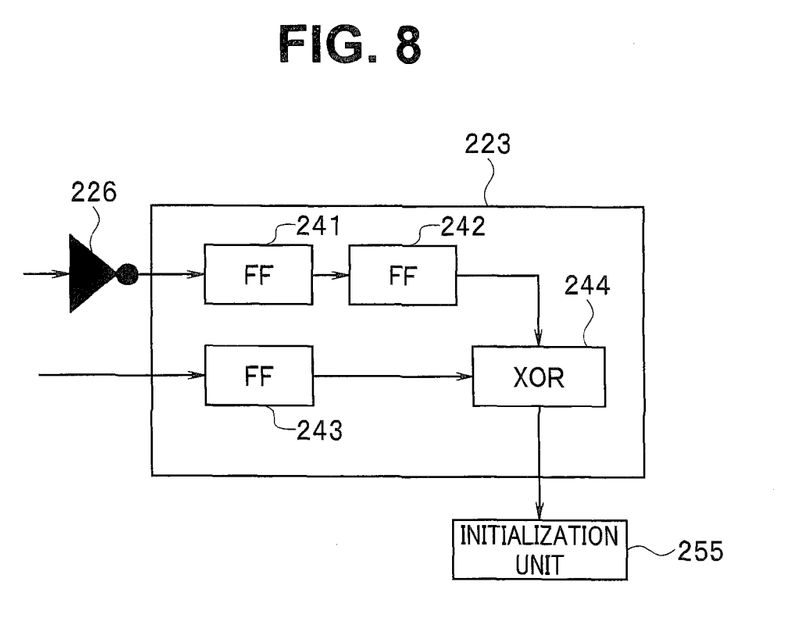
FIG. 8 is a block diagram showing a configuration of a phase difference monitoring unit and an initialization unit in the processing apparatus according to the third embodiment.

FIG. 8 is a block diagram showing a configuration of the phase difference monitoring unit and the initialization unit in the processing apparatus (endoscope) according to the third embodiment.

As shown in FIG. 8, the phase difference monitoring unit 223 includes: a flip-flop circuit 243 (hereinafter, written as FF 243) configured to input the second clock signal output from the PLL circuit 222; a flip-flop circuit 241 (hereinafter, written as FF 241) configured to input a clock signal obtained by inverting the second clock signal through an inverter 226; a flip-flop circuit 242 (hereinafter, written as FF 242) configured to input an output signal of the FF 241; and an exclusive OR circuit 244 (hereinafter, written as XOR 244) configured to input output signals of the FF 243 and the FF 242.

The FF 243, the FF 241, and the FF 242 are so-called D flip-flop circuits and are configured to delay the input second clock signal by one clock each in the present embodiment.

That is, the second clock signal output from the PLL circuit 222 is delayed by one clock by the FF 243 on one hand and is delayed by two clocks by the FF 241 and the FF 242 after the inversion by the inverter 226 on the other hand. As a result, inverted outputs of adjacent clocks of the second clock signal are input to the XOR 244.

Figure 9:
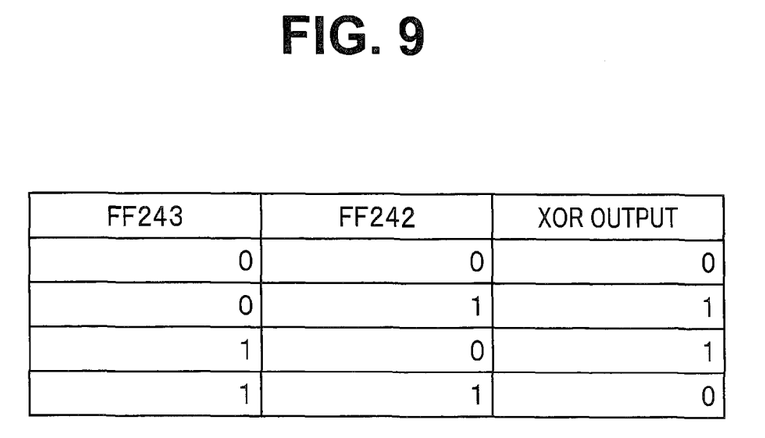
FIG. 9 is a chart showing a truth table of an XOR circuit in a phase difference monitoring unit in the processing apparatus according to the third embodiment.

FIG. 9 is a chart showing a truth table of the XOR circuit in the phase difference monitoring unit in the processing apparatus according to the third embodiment.

As described, the second clock signal output from the PLL circuit 222 and the clock signal obtained by inverting the second clock signal and delayed by one clock are input to the XOR 244, and the XOR 244 is configured to output an exclusive OR signal of the two clock signals.

In other words, the output of the FF 243 and the output of the FF 242 are signals inverted from each other in a state in which the same second clock signal is shifted by one clock. Therefore, the signals make transitions in the inverted state each other if the second clock signal is in the normal state, and the XOR 244 outputs, as a monitoring output signal, a signal of the "H" state indicating that there is no abnormality (see FIG. 9).

On the other hand, if there is an abnormality, such as a phase shift, in the second clock signal for some factors, the inverted state of the output of the FF 243 and the output of the FF 242 is lost, and both are in the "L" state or the "H" state. Therefore, the XOR 244 outputs, as a monitoring output signal, a signal of the "L" state indicating the abnormal state (see FIG. 9).

In this way, the phase difference monitoring unit 223 plays a role as a monitoring unit configured to monitor (detect) the state of the phase difference between adjacent clocks in the second clock signal from the PLL circuit 222 and configured to output a predetermined monitoring output signal when an abnormality is found in the detected state of the phase difference.

Figure 10:
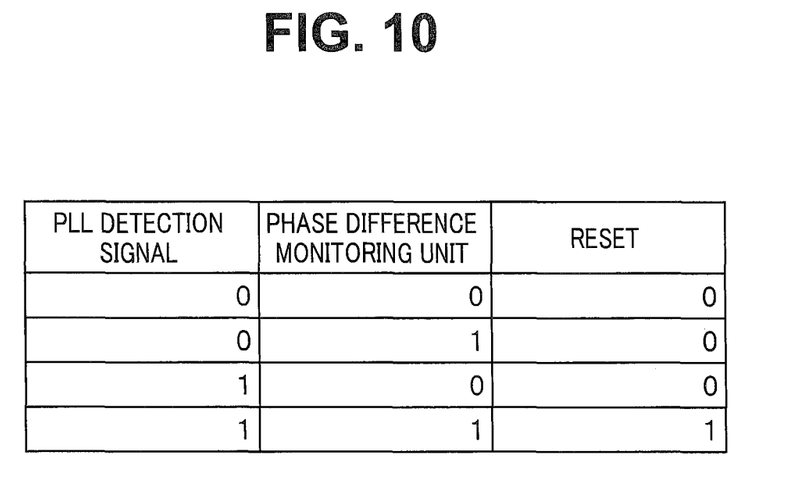
FIG. 10 is a chart showing a truth table of an initialization unit in the processing apparatus according to the third embodiment.

FIG. 10 is a chart showing a truth table of the initialization unit in the processing apparatus according to the third embodiment.

The initialization unit 225 is configured by an AND circuit configured to generate a logical product of the detection signal output from the PLL circuit 222 and the monitoring output signal output from the phase difference monitoring unit 223 as in the first embodiment.

That is, the initialization unit 225 is configured to input the "detection signal" from the PLL circuit 222 and the "monitoring output signal" from the phase difference monitoring unit 223 and configured to output an active "L" reset signal according to the logical product of the signals.

More specifically, as shown in the truth table of FIG. 10, the active "L" reset signal is output when the locked state at the predetermined frequency is lost in the PLL circuit 222 for some factors (in this case, "detection signal" is "L" signal) or when there is a phase shift in the second clock signal in the phase difference monitoring unit 223 for some factors (in this case, "monitoring output signal" is "L" signal).

In the third embodiment, the reset signal output from the initialization unit 225 is input to the PLL circuit 222, and the PLL circuit 222 that has received the reset signal starts a new PLL process as in the first embodiment.

As in the first embodiment, the reset signal output from the initialization unit 225 is also input to predetermined circuits of the various operation units 224 that are circuits formed inside of the FPGA, and each of the corresponding circuits is surely reset.

As described, according to the third embodiment, the initialization unit 225 outputs the reset signal not only when the detection signal indicating the abnormal state (lock signal indicating the unlocked state) is output because the locked state at the predetermined frequency is lost in the PLL circuit 222 for some factors, but also when the phase difference monitoring unit 223 detects the phase shift of the second clock signal even when the detection signal (lock signal indicating the unlocked state) is not output in the abnormal state. The PLL circuit 222 and the corresponding circuits of the various operation units 224 in the FPGA unit 221 can be surely reset.

Note that although the endoscope (particularly, the connector unit provided on the endoscope side) connected to the video processor is illustrated as an example of the processing apparatus, and the endoscope system including the endoscope and the video processor is illustrated as an example of the processing system in the embodiments, the present invention is not limited to this. It is obvious that the present invention can be applied to a processing apparatus including a phase synchronization circuit (PLL circuit) and a processing system including the processing apparatus.

According to the present invention, a processing apparatus and a processing system capable of surely performing the reset operation regardless of the state of the lock signal when there is an abnormality in the output clock of the PLL circuit can be provided in the processing apparatus and the processing system including the PLL circuit.

The present invention is not limited to the embodiments described above, and various changes, modifications, and the like can be made without changing the scope of the present invention.

What is claimed is:

1. A processing apparatus comprising:
    a programmable logic circuit connected to an oscillator configured to output a first clock, the programmable logic circuit being configured to input the first clock; and
    a memory storing circuit information of the programmable logic circuit, wherein
    the programmable logic circuit comprises:
    a phase synchronization circuit configured to generate and output a second clock with a frequency of a predetermined ratio with respect to a frequency of the first clock based on the first clock;
    a detection unit provided on the phase synchronization circuit and configured to detect an asynchronous state of the first clock and the second clock to output a predetermined detection signal;
    an arithmetic unit configured to execute a predetermined process based on the second clock;
    a monitoring unit configured to detect a ratio between the frequencies of the first clock and the second clock, compare the detected ratio with the predetermined ratio, and output a predetermined abnormal signal when the detected ratio does not coincide with the predetermined ratio; and
    an initialization unit configured to generate a reset signal when the monitoring unit outputs the abnormal signal, also generate the reset signal when the detection unit outputs the detection signal, and output the reset signal to the phase synchronization circuit and the arithmetic unit in either case.

2. A processing system comprising:
    the processing apparatus according to claim 1; and
    the oscillator configured to output the first clock to the programmable logic circuit.

3. A processing apparatus comprising:
    a programmable logic circuit connected to an oscillator configured to output a first clock, the programmable logic circuit being configured to input the first clock; and
    a memory storing circuit information of the programmable logic circuit, wherein
    the programmable logic circuit comprises:
    a phase synchronization circuit configured to generate and output a second clock with a frequency of a predetermined ratio with respect to a frequency of the first clock based on the first clock;
    a detection unit provided on the phase synchronization circuit and configured to detect an asynchronous state of the first clock and the second clock to output a predetermined detection signal;
    an arithmetic unit configured to execute a predetermined process based on the second clock;
    a monitoring unit configured to compare two adjacent clock signals in the second clock and output a predetermined abnormal signal when detecting a predetermined phase difference; and
    an initialization unit configured to generate a reset signal when the monitoring unit outputs the abnormal signal, also generate the reset signal when the detection unit outputs the detection signal, and output the reset signal to the phase synchronization circuit and the arithmetic unit in either case.

4. A processing system comprising:
    the processing apparatus according to claim 3; and
    the oscillator configured to output the first clock to the programmable logic circuit.

5. A processing apparatus comprising:
    a programmable logic circuit connected to an oscillator configured to output a first clock, the programmable logic circuit being configured to input the first clock; and
    a memory storing circuit information of the programmable logic circuit, wherein
    the programmable logic circuit comprises:
    a first phase synchronization circuit configured to generate and output a second clock with a frequency of a first predetermined ratio with respect to a frequency of the first clock based on the first clock;
    a second phase synchronization circuit configured to generate and output a third clock with a frequency of a second predetermined ratio with respect to the frequency of the first clock based on the first clock;
    a first detection unit provided on the first phase synchronization circuit and configured to detect an asynchronous state of the first clock and the second clock to output a predetermined first detection signal;
    a second detection unit provided on the second phase synchronization circuit and configured to detect an asynchronous state of the first clock and the third clock to output a predetermined second detection signal;
    an arithmetic unit comprising a first arithmetic circuit configured to execute a predetermined process based on the second clock and a second arithmetic circuit configured to execute a predetermined process based on the third clock;
    a monitoring unit configured to output a predetermined abnormal signal when at least one of the second clock and the third clock is in a predetermined abnormal state; and
    an initialization unit configured to generate a reset signal when the monitoring unit outputs the abnormal signal, also generate the reset signal when the first detection unit outputs the first detection signal, further generate the reset signal when the second detection unit outputs the second detection signal, and output the reset signal to the phase synchronization circuit and the arithmetic unit in any case.

6. The processing apparatus according to claim 5, wherein the monitoring unit outputs the abnormal signal when the monitoring unit detects a ratio between the frequencies of the first clock and the second clock, and the detected ratio does not coincide with the first predetermined ratio, and/or when the monitoring unit detects a ratio between the frequencies of the first clock and the third clock, and the detected ratio does not coincide with the second predetermined ratio.

7. A processing system comprising:
    the processing apparatus according to claim 5; and the oscillator configured to output the first clock to the programmable logic circuit.

* * * * *